(12) United States Patent　　(10) Patent No.:　　US 12,095,254 B2
Chen et al.　　　　　　　　　　(45) Date of Patent:　　　Sep. 17, 2024

(54) ELECTRONIC DEVICE AND TEMPERATURE DETECTION DEVICE THEREOF

(71) Applicant: LEAP Semiconductor Corp., Taoyuan (TW)

(72) Inventors: Wei-Fan Chen, Taichung (TW); Kuo-Chi Tsai, Taoyuan (TW)

(73) Assignee: LEAP Semiconductor Corp., Taoyuan (TW)

( * ) Notice: Subject to any disclaimer, the term of this patent is extended or adjusted under 35 U.S.C. 154(b) by 184 days.

(21) Appl. No.: 18/071,621

(22) Filed: Nov. 30, 2022

(65) Prior Publication Data

US 2024/0113512 A1　　Apr. 4, 2024

(30) Foreign Application Priority Data

Sep. 29, 2022　　(TW) .................................. 111137002

(51) Int. Cl.
*H02H 5/04*　　　(2006.01)
*G01K 3/00*　　　(2006.01)
(Continued)

(52) U.S. Cl.
CPC ............. *H02H 5/044* (2013.01); *G01K 3/005* (2013.01); *G01K 7/01* (2013.01); *H01L 27/0629* (2013.01)

(58) Field of Classification Search
CPC ........ H02H 5/044; H02H 5/047; G01K 3/005; G01K 7/01; G01K 7/24; G01K 7/16; H01L 27/0629; H03K 17/687
(Continued)

(56) References Cited

U.S. PATENT DOCUMENTS 5,008,736 A　　4/1991　Davies
6,046,470 A　*　4/2000　Williams ............ H01L 29/7804
　　　　　　　　　　　　　　　　　　　257/470
(Continued)

FOREIGN PATENT DOCUMENTS

CN　　　　109580023　　　　4/2019
CN　　　112513771 A　*　3/2021　............... G05F 1/56
WO　WO-2020199216 A1　*　10/2020　............... H03B 5/04

OTHER PUBLICATIONS

"Office Action of Taiwan Counterpart Application", issued on Nov. 7, 2023, p. 1-p. 7.
(Continued)

*Primary Examiner* — Dharti H Patel
(74) *Attorney, Agent, or Firm* — JCIPRNET (57) ABSTRACT

An electronic device and a temperature detection device thereof are provided. The temperature detection device includes a differential stage circuit and an output stage circuit. The differential stage circuit includes a first differential end and a second differential end, and includes a cross-coupled transistor element, a first resistor and a second transistor. The cross-coupled transistor element receives a first voltage. The first resistor is coupled between the first differential end and a second voltage, and the first resistor is poly-silicon resistor. The second resistor is coupled between the second differential end and the second voltage, and the second resistor is a silicon carbide diffusion resistor. The output stage circuit generates a driving voltage according to a first control voltage on the first differential end and a second control voltage on the second differential end.

18 Claims, 7 Drawing Sheets

(51) Int. Cl.
 *G01K 7/01* (2006.01)
 *H01L 27/06* (2006.01)
(58) Field of Classification Search
 USPC .......................................................... 361/103
 See application file for complete search history.

(56) References Cited

U.S. PATENT DOCUMENTS

| | | | | |
|---|---|---|---|---|
| 6,140,806 | A | * | 10/2000 | Gohara ................. H03K 17/18 |
| | | | | 323/283 |
| 6,160,691 | A | * | 12/2000 | Shen ................. H03K 17/0828 |
| | | | | 361/91.1 |
| 6,166,893 | A | * | 12/2000 | Shen ................ H03K 17/08148 |
| | | | | 361/170 |
| 7,180,211 | B2 | | 2/2007 | Sinha et al. |
| 7,368,784 | B2 | | 5/2008 | Botti et al. |
| 7,400,545 | B2 | * | 7/2008 | Ramaraju ............. G11C 11/413 |
| | | | | 365/154 |
| 7,524,108 | B2 | * | 4/2009 | Yoshida .................... G05F 3/30 |
| | | | | 374/171 |
| 7,808,294 | B1 | * | 10/2010 | Kottapalli ........ H03K 3/356113 |
| | | | | 327/333 |
| 8,624,637 | B2 | | 1/2014 | Asam et al. |
| 10,819,102 | B2 | | 10/2020 | Mayell |
| 10,833,668 | B2 | | 11/2020 | Lai et al. |
| 10,903,790 | B1 | * | 1/2021 | Jin .......................... H03L 1/027 |
| 11,615,820 | B1 | * | 3/2023 | Capecchi ............. G11C 13/003 |
| | | | | 365/185.21 |
| 11,923,845 | B1 | * | 3/2024 | Kronmuller ..... H03K 3/356182 |
| 2008/0204079 | A1 | * | 8/2008 | Park ......................... H03K 3/00 |
| | | | | 326/81 |
| 2014/0016669 | A1 | | 1/2014 | Chowdhury et al. |
| 2018/0287609 | A1 | * | 10/2018 | Mallavajula ..... H03K 3/356017 |
| 2021/0359093 | A1 | | 11/2021 | Lee |

OTHER PUBLICATIONS

D. M. Nguyen et al., "Comparison of electrical properties of ohmic contact realized on p-type 4H-SiC", Materials Science Forum, Sep. 26, 2008, pp. 1-5.

M. A. Capano et al., "Ionization energies and electron mobilities in phosphorus- and nitrogen-implanted 4Hsilicon carbide", Journal of Applied Physics, Jun. 15, 2000, pp. 1-6.

Maxime Berthou et al., "Monolithically Integrated Temperature Sensor in Silicon Carbide Power MOSFETs", IEEE Transactions on Power Electronics, Nov. 17, 2013, pp. 4970-4977.

Manjula S. Raman et al., "Physical Model for the Resistivity and Temperature Coefficient of Resistivity in Heavily Doped Polysilicon", IEEE Transactions on Electron Devices , Jul. 24, 2006, pp. 1885-1892.

Xiao-Yu Tang et al., "Characteristics and Breakdown Behaviors of Polysilicon Resistors for High Voltage Applications", Advances in Condensed Matter Physics, Apr. 27, 2015, pp. 1-6.

* cited by examiner

ELECTRONIC DEVICE AND TEMPERATURE DETECTION DEVICE THEREOF

CROSS-REFERENCE TO RELATED APPLICATION

This application claims the priority benefit of Taiwan application serial no. 111137002, filed on Sep. 29, 2022. The entirety of the above-mentioned patent application is hereby incorporated by reference herein and made a part of this specification.

BACKGROUND

Technical Field

The disclosure relates to an electronic device and a temperature detection device thereof, and more particularly, to an electronic device and a temperature detection device thereof that may quickly activate an over-temperature protection mechanism.

Description of Related Art

Power transistors often operate in high temperature environments and are therefore particularly sensitive to upper operating limits of temperature. When power transistors operate in an environment at an upper-limit temperature, they are particularly prone to damage when the power transistors undergo a state transition phenomenon.

Based on the above, it is important to detect the ambient temperature for the operation of the power transistor. The key point is whether the response speed of the temperature detection circuit to the temperature detection is fast enough to protect the power transistor from damage. However, if the temperature detection circuit is designed to be too sensitive, it may cause the temperature detection operation to malfunction and turn off the operation of the power transistor by mistake. Therefore, how to design a temperature detection circuit that may correctly determine and quickly respond to the over-temperature phenomenon is an important issue for those skilled in the art.

SUMMARY

The disclosure provides an electronic device and a temperature detection device thereof, which may quickly complete the temperature detection operation, and quickly cut off the power supply of the electronic device when an over-temperature phenomenon occurs.

A temperature detection device according to the disclosure includes a differential stage circuit and an output stage circuit. The differential stage circuit has a first differential end and a second differential end and includes a cross-coupled transistor element, a first resistor and a second resistor. The cross-coupled transistor element receives a first voltage and is coupled to the first differential end and the second differential end. The first resistor is coupled between the first differential end and a second voltage, and the first resistor is poly-silicon resistor. The second resistor is coupled between the second differential end and the second voltage, and the second resistor is silicon carbide diffusion resistor. The output stage circuit is coupled to the first differential end and the second differential end and generates a driving voltage according to a first control voltage on the first differential end and a second control voltage on the second differential end.

An electronic device according to the disclosure includes a temperature detection device as described above and a power transistor. The power transistor is coupled to the temperature detection device. The power transistor receives an operating power and is controlled by the driving voltage.

Based on the above, the temperature detection device of the disclosure generates the first control voltage and the second control voltage respectively by using the first resistor and the second resistor with different temperature sensitivities, and generates the driving voltage through the output stage circuit according to the first control voltage and the second control voltage. The driving voltage may be used to quickly cut off the power transistor in the electronic device when the over-temperature phenomenon occurs, so as to effectively achieve the effect of over-temperature protection.

DESCRIPTION OF EMBODIMENTS

Figure 1:
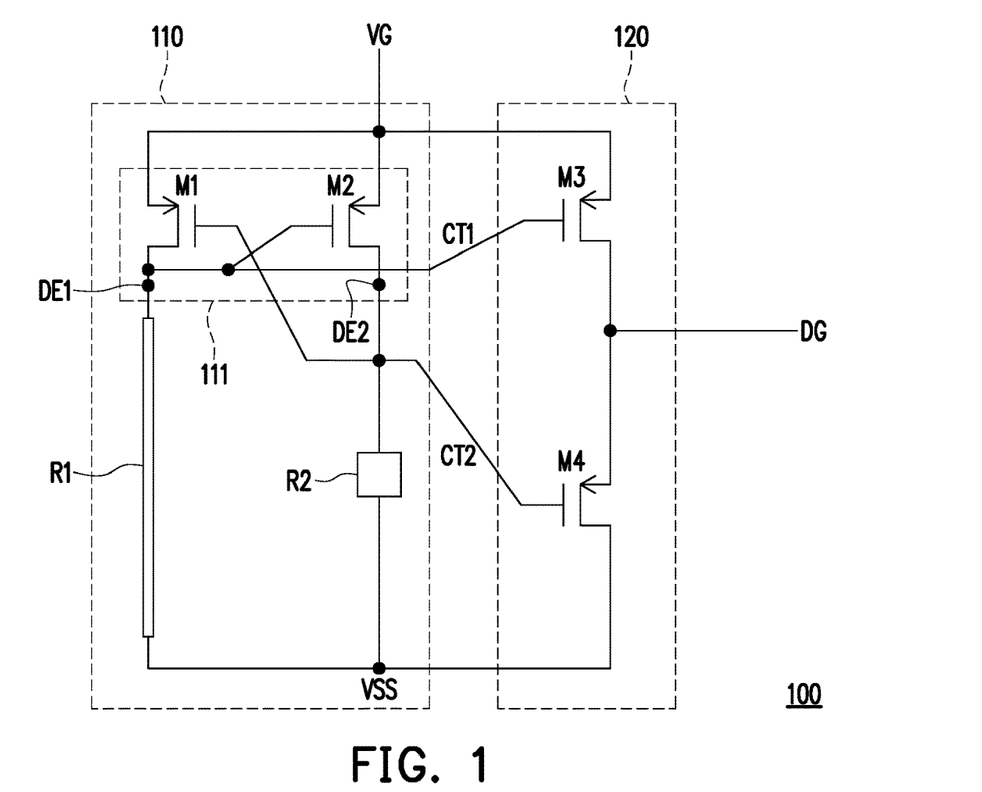
FIG. 1 is a schematic diagram of a temperature detection device according to an embodiment of the disclosure.

Please refer to FIG. 1. FIG. 1 is a schematic diagram of a temperature detection device according to an embodiment of the disclosure. The temperature detection device 100 includes a differential stage circuit 110 and an output stage circuit 120. The differential stage circuit 110 is coupled to the output stage circuit 120, and the differential stage circuit 110 includes a cross-coupled transistor element 111, a first resistor R1 and a second resistor R2. In this embodiment, the cross-coupled transistor element 111 receives a voltage VG and is coupled to a first differential end DE1 and a second differential end DE2 of the differential stage circuit 110. The cross-coupled transistor element 111 includes transistors M1 and M2. The first end of the transistor M1 receives the voltage VG, and the second end of the transistor M1 is coupled to the first differential end DE1, and the control end of the transistor M1 is coupled to the second differential end DE2. The first end of the transistor M2 receives the voltage VG, and the second end of the transistor M2 is coupled to the second differential end DE2, and the control end of the transistor M2 is coupled to the first differential end DE1.

The first resistor R1 is coupled between the first differential end DE1 and a voltage VSS, and the second resistor R2 is coupled between the second differential end DE2 and the voltage VSS.

In this embodiment, the first resistor R1 may be a poly-silicon resistor, and the second resistor R2 may be a SiC (silicon carbide) diffusion resistor. In addition, the temperature sensitivity of the resistance value of the first resistor R1, which is a poly-silicon resistor, is much lower than the temperature sensitivity of the resistance value of the second resistor R2, which is a SiC diffusion resistor.

Through the above-mentioned characteristics of the first resistor R1 and the second resistor R2, the differential stage circuit 110 may generate the control voltages CT1 and CT2 on the first differential end DE1 and the second differential end DE2, respectively, based on the change of the resistance value of the second resistor R2 according to the change of the ambient temperature. The differential stage circuit 110 also transmits the control voltages CT1 and CT2 to the output stage circuit 120.

The output stage circuit 120 includes transistors M3 and M4. The transistors M3 and M4 are coupled in series between the voltage VG and the voltage VSS. In addition, the first end of the transistor M3 receives the voltage VG, and the second end of the transistor M3 is coupled to the first end of the transistor M4 and is used to generate the driving voltage DG, and the control ends of the transistors M3 and M4 are respectively coupled to the first differential end DE1 and the second differential end DE2 and respectively receive the control voltages CT1 and CT2.

In this embodiment, the voltage VG is a power supply voltage, and the voltage VSS is a reference ground voltage. In addition, the transistors M1 and M2 may both be P-type transistors, and the transistors M3 and M4 may also be P-type transistors.

Figure 2A:
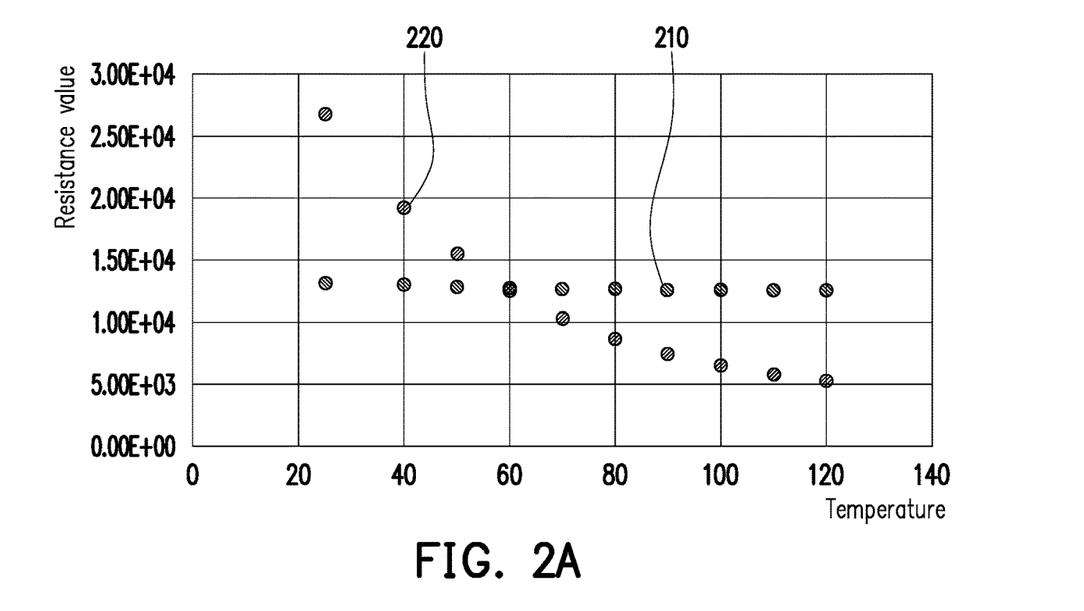
FIG. 2A is a diagram showing the relationship between the resistance values of the first resistor and the second resistor and the temperature change in the temperature detection device according to an embodiment of the disclosure.

For details of the operation of the temperature detection device 100, please refer to FIG. 1 and FIG. 2A together. FIG. 2A is a diagram showing the relationship between the resistance values of the first resistor and the second resistor and the temperature change in the temperature detection device according to this embodiment of the disclosure. In FIG. 2, the curve 210 is the trend of the resistance value of the first resistor R1 changing with temperature. The curve 220 is the trend of the resistance value of the second resistor R2 changing with temperature. The resistance value of the first resistor R1 is substantially maintained at a fixed value at a temperature between 20 degrees Celsius and 120 degrees Celsius. In addition, the resistance value of the second resistor R2 has a large change in the negative temperature coefficient at a temperature between 20 degrees Celsius and 120 degrees Celsius.

That is, in the temperature detection device 100, when the ambient temperature is lower than a predetermined value (for example, 40 degrees Celsius), the resistance value of the second resistor R2 may be greater than the resistance value of the first resistor R1. At this time, the control voltage CT2 on the second differential end DE2 may have a relatively high voltage value and cause the transistor M1 to be turned off. Based on the turned-off transistor M1, the control voltage CT1 on the first differential end DE1 may be pulled down by the first resistor R1 to have a relatively low voltage value (for example, equal to the voltage VSS), and the transistor M2 is turned on. The turned-on transistor M2 may further pull up the control voltage CT2 on the second differential end DE2 to the voltage VG.

Correspondingly, in the output stage circuit 120, the transistor M3 is turned on according to the control voltage CT1, and the transistor M4 is turned off according to the control voltage CT2. The output stage circuit 120 may generate the driving voltage DG equal to the voltage VG and indicate that the over-temperature protection mechanism is not activated.

When the ambient temperature is greater than the above-mentioned predetermined value (for example, 40 degrees Celsius), and less than another predetermined value (for example, 90 degrees Celsius), based on the resistance value of the second resistor R2 being close to the resistance value of the first resistor R1, the transistors M1 and M2 may work in the linear region, and the voltages of the control voltages CT1 and CT2 generated by the differential stage circuit 110 are close to each other, which drive the transistors M3 and M4 in the output stage circuit 120 to also work in the linear region. In this way, the driving voltage DG that may be generated by the output stage circuit 120 may be between the voltage VG and the voltage VSS, indicating that the over-temperature protection mechanism is critical to the edge to be activated.

When the ambient temperature is greater than 90 degrees Celsius, the resistance value of the second resistor R2 is smaller than the resistance value of the first resistor R1 to a certain extent, and is sufficient to turn on the transistor M1 and turn off the transistor M2. In such a state, the differential stage circuit 110 may generate the control voltage CT1 close to the voltage VG and generate the control voltage CT2 close to the voltage VSS. The transistor M3 in the output stage circuit 120 is turned off, and the transistor M4 may be turned on, thereby generating the driving voltage DG equal to the voltage VSS, and indicating that the over-temperature protection mechanism has been activated.

In this embodiment, the resistance values of the first resistor R1 and the second resistor R2 may be set by adjusting the number of ports of the first resistor R1 and the second resistor R2 during layout. Here, in an integrated circuit, when a resistor is laid out in a rectangle, the quotient of its total length and its width is the number of ports. In this embodiment, the number of ports of the first resistor R1 may be 40 ports, and the number of ports of the second resistor R2 may be 1 port.

Figure 2B:
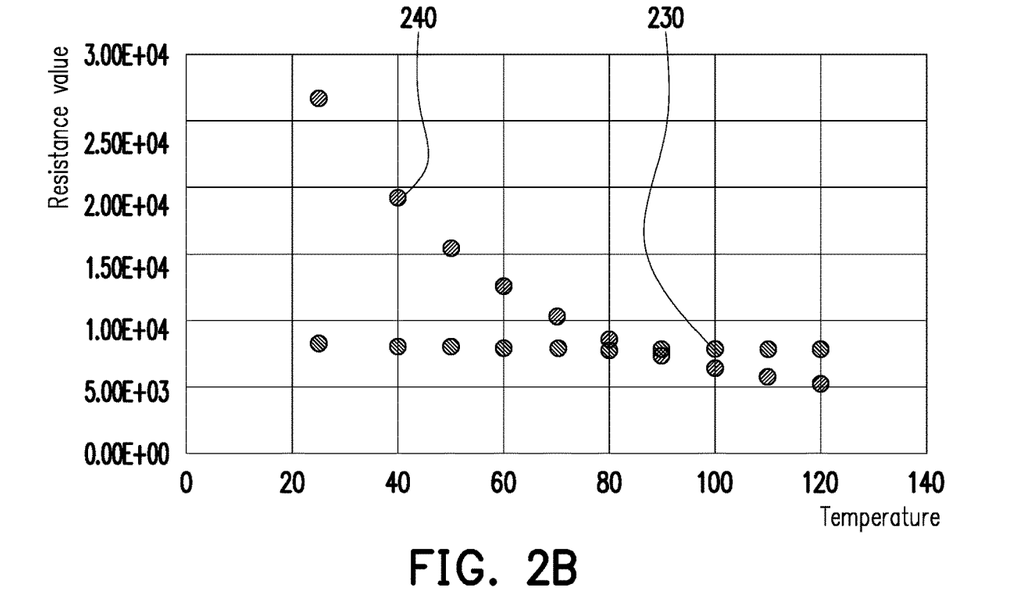
FIG. 2B is a diagram showing the relationship between the resistance values of the first resistor and the second resistor and the temperature change in the temperature detection device according to another embodiment of the disclosure.

In other embodiments of the disclosure, the proportional relationship between the number of ports of the first resistor R1 and the number of ports of the second resistor R2 may be adjusted. Please refer to FIG. 1 and FIG. 2B together. FIG. 2B is a diagram showing the relationship between the resistance values of the first resistor and the second resistor and the temperature change in the temperature detection device according to another embodiment of the disclosure. In the embodiment of FIG. 2B, the number of ports of the first resistor R1 may be reduced to 25 ports, and the number of ports of the second resistor R2 may be maintained at 1 port. The curve 230 is the trend of the resistance value of the first resistor R1 changing with temperature. The curve 240 is the trend of the resistance value of the second resistor R2 changing with temperature.

Through the above adjustment, the temperature detection device 100 may generate a driving voltage DG equal to the voltage VG when the ambient temperature is lower than 70 degrees Celsius to indicate that the over-temperature protection mechanism is not activated. When the temperature is between 70 degrees Celsius and 110 degrees Celsius, the temperature detection device 100 may generate a driving voltage DG between the voltages VG and VSS to indicate that the over-temperature protection mechanism is critical to the edge to be activated. In addition, when the temperature is higher than 110 degrees Celsius, the temperature detection device 100 may generate a driving voltage DG equal to the voltage VSS to indicate that the over-temperature protection mechanism has been activated.

It may be known from the above description that the temperature detection device 100 of the embodiment of the disclosure may adjust the temperature value for activating the over-temperature protection mechanism by adjusting the number of layout ports of one of the first resistor R1 and the second resistor R2.

In addition, in this embodiment, the second resistor R2 may be a P-type SiC diffusion resistor, or may also be an N-type SiC diffusion resistor, and there is no particular limit.

Figure 3:
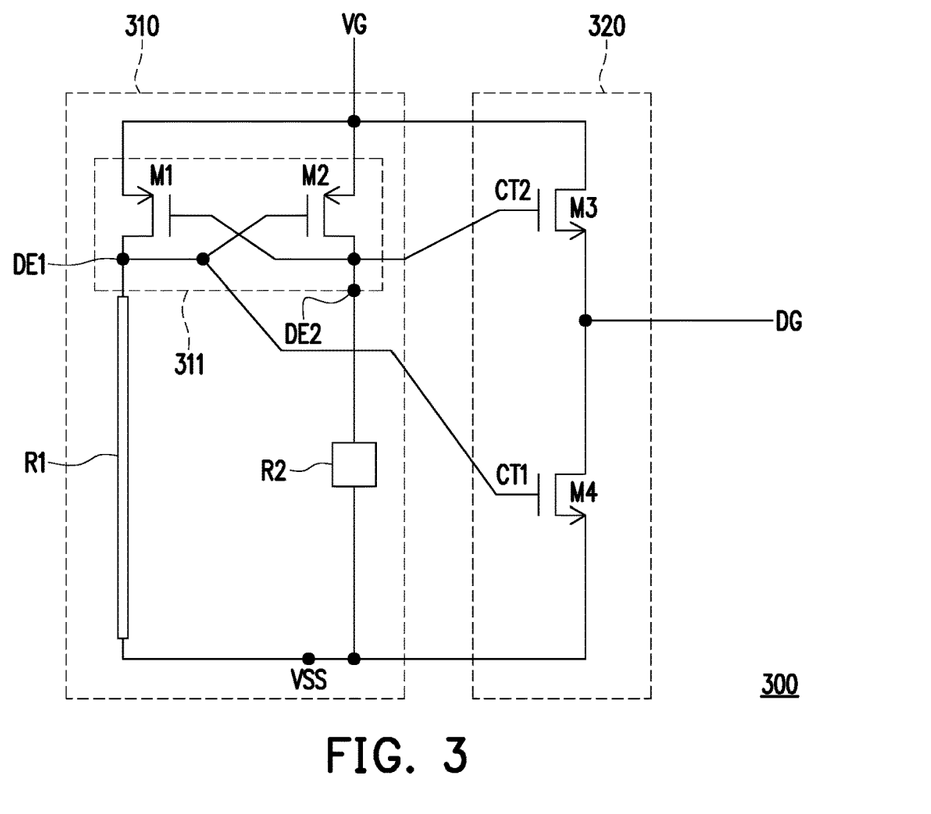
FIG. 3 is a schematic diagram of a temperature detection device according to another embodiment of the disclosure.

Please refer to FIG. 3. FIG. 3 is a schematic diagram of a temperature detection device according to another embodiment of the disclosure. The temperature detection device 300 includes a differential stage circuit 310 and an output stage circuit 320. The differential stage circuit 310 is coupled to the output stage circuit 320, and the differential stage circuit 310 includes a cross-coupled transistor element 311, a first resistor R1 and a second resistor R2.

What is different from the embodiment of FIG. 1 is that in this embodiment, the transistors M3 and M4 in the output stage circuit 320 are N-type transistors. Moreover, the control end of the transistor M3 is coupled to the second differential end DE2 to receive the control voltage CT2, and the control end of the transistor M4 is coupled to the first differential end DE1 to receive the control voltage CT1.

Compared with the embodiment of FIG. 1, in this embodiment, by changing the conductivity types of the transistors M3 and M4 and by switching the transistors M3 and M4 to receive the control voltages CT2 and CT1, respectively, the temperature detection device 300 may have similar circuit operation as the temperature detection device 100, and details are omitted here.

Figure 4:
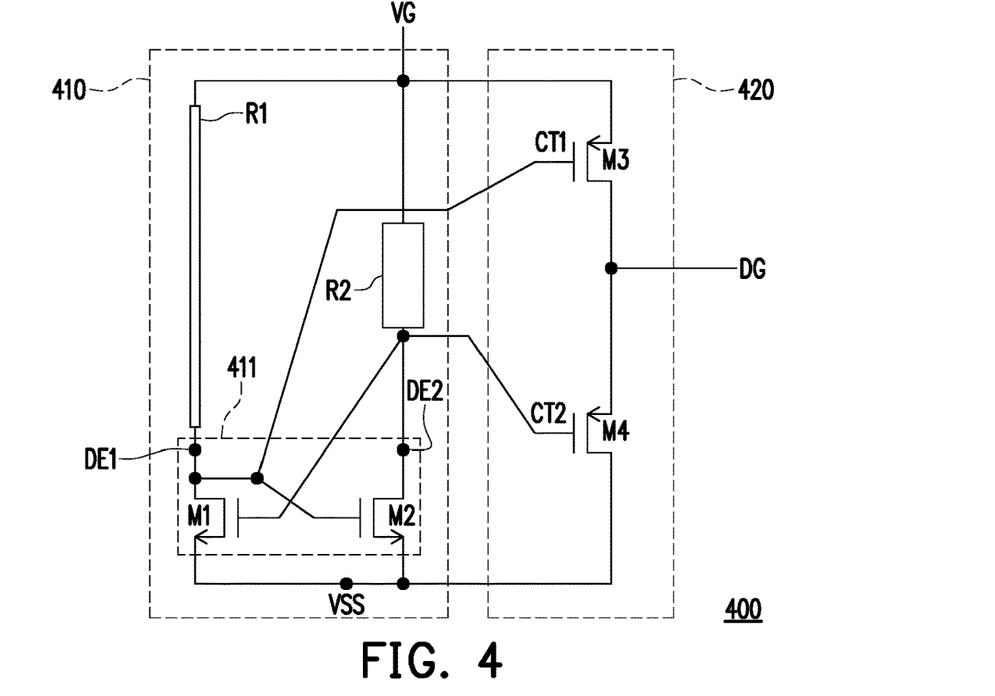
FIG. 4 is a schematic diagram of a temperature detection device according to another embodiment of the disclosure.

Please refer to FIG. 4 for the following description. FIG. 4 is a schematic diagram of a temperature detection device according to another embodiment of the disclosure. The temperature detection device 400 includes a differential stage circuit 410 and an output stage circuit 420. The differential stage circuit 410 is coupled to the output stage circuit 420, and the differential stage circuit 410 includes a cross-coupled transistor element 411, a first resistor R1 and a second resistor R2. In this embodiment, the cross-coupled transistor element 411 receives a voltage VSS and is coupled to a first differential end DE1 and a second differential end DE2 of the differential stage circuit 410. The cross-coupled transistor element 411 includes transistors M1 and M2. The first end of the transistor M1 receives the voltage VSS, and the second end of the transistor M1 is coupled to the first differential end DE1, and the control end of the transistor M1 is coupled to the second differential end DE2. The first end of the transistor M2 receives the voltage VSS, and the second end of the transistor M2 is coupled to the second differential end DE2, and the control end of the transistor M2 is coupled to the first differential end DE1.

The output stage circuit 420 includes transistors M3 and M4. The transistors M3 and M4 are coupled in series between the voltages VG and VSS. The control ends of the transistors M3 and M4 are respectively coupled to the first differential end DE1 and the second differential end DE2, and receive the control voltages CT1 and CT2 respectively. The transistors M3 and M4 generate the driving voltage DG.

In this embodiment, the differential stage circuit 410 is a complementary type of the differential stage circuit 110 in FIG. 1. The transistors M1 and M2 are N-type transistors. In addition, the first resistor R1 is coupled between the first differential end DE1 and a voltage VG, and the second resistor R2 is coupled between the second differential end DE2 and the voltage VG. That is, by coupling the first resistor R1 and the second resistor R2 to the upper ends of the transistors M1 and M2 respectively, the differential stage circuit 410 may generate the same control voltages CT1 and CT2 as those of the differential stage circuit 110.

The output stage circuit 420 of this embodiment is the same as the output stage circuit 120 of FIG. 1, and details are not repeated here.

In this embodiment, the first resistor R1 may be a polysilicon resistor, and the second resistor R2 may be an N-type or P-type SiC diffusion resistor.

Figure 5:
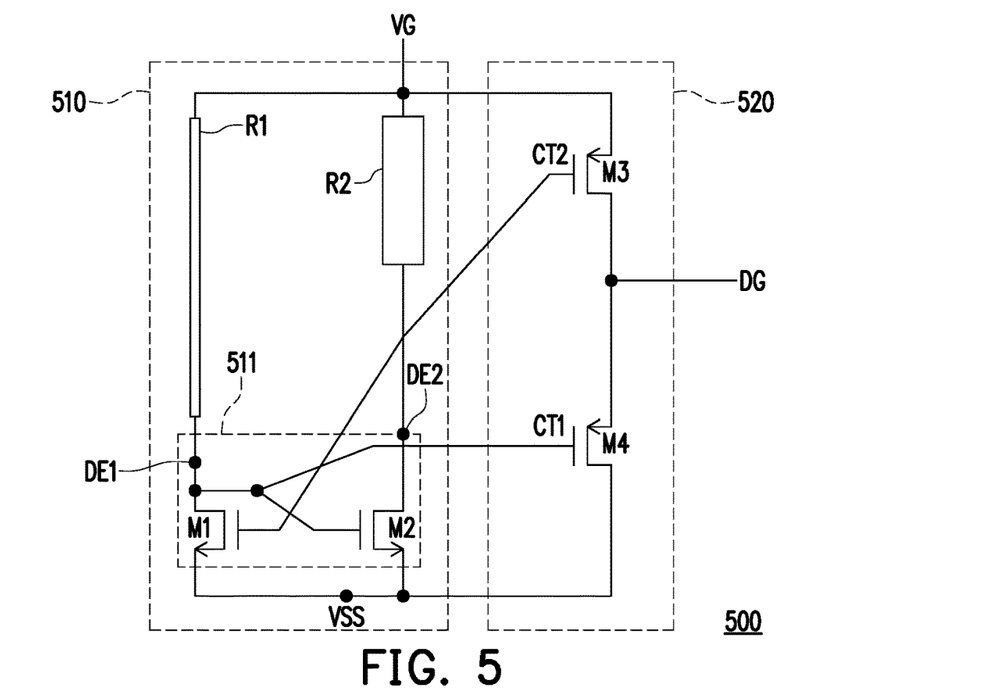
FIG. 5 is a schematic diagram of a temperature detection device according to another embodiment of the disclosure.

Please refer to FIG. 5 for the following description. FIG. 5 is a schematic diagram of a temperature detection device according to another embodiment of the disclosure. The temperature detection device 500 includes a differential stage circuit 510 and an output stage circuit 520. The differential stage circuit 510 is coupled to the output stage circuit 520, and the differential stage circuit 510 includes a cross-coupled transistor element 511, a first resistor R1 and a second resistor R2. In this embodiment, the cross-coupled transistor element 511 receives a voltage VSS and is coupled to a first differential end DE1 and a second differential end DE2 of the differential stage circuit 510. The cross-coupled transistor element 511 includes transistors M1 and M2. The first end of the transistor M1 receives the voltage VSS, and the second end of the transistor M1 is coupled to the first differential end DE1, and the control end of the transistor M1 is coupled to the second differential end DE2. The first end of the transistor M2 receives the voltage VSS, and the second end of the transistor M2 is coupled to the second differential end DE2, and the control end of the transistor M2 is coupled to the first differential end DE1.

The output stage circuit 520 includes transistors M3 and M4. The transistors M3 and M4 are coupled in series between the voltages VG and VSS. The control ends of the transistors M3 and M4 are respectively coupled to the first differential end DE1 and the second differential end DE2, and receive the control voltages CT1 and CT2 respectively. The transistors M3 and M4 generate the driving voltage DG.

In this embodiment, the differential stage circuit 410 is a complementary type of the differential stage circuit 310 in FIG. 3. The transistors M1 and M2 are N-type transistors. In addition, the first resistor R1 is coupled between the first differential end DE1 and a voltage VG, and the second resistor R2 is coupled between the second differential end DE2 and the voltage VG. That is, by coupling the first resistor R1 and the second resistor R2 to the upper ends of the transistors M1 and M2 respectively, the differential stage circuit 510 may generate the same control voltages CT1 and CT2 as those of the differential stage circuit 310.

The output stage circuit 520 of this embodiment is the same as the output stage circuit 320 of FIG. 3, and details are not repeated here.

In this embodiment, the first resistor R1 may be a polysilicon resistor, and the second resistor R2 may be an N-type or P-type SiC diffusion resistor.

Figure 6:
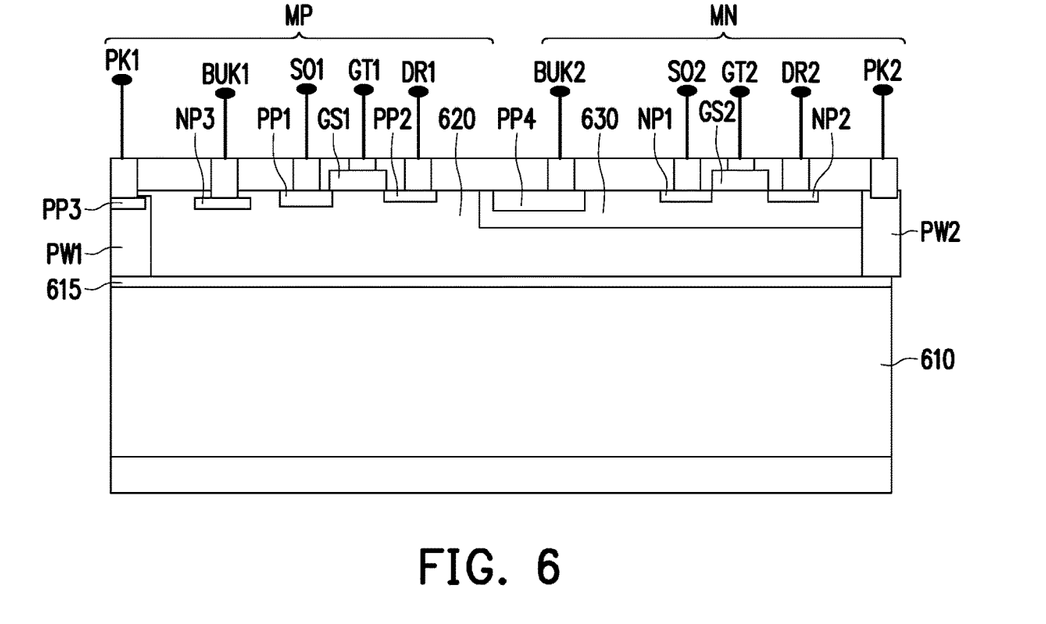
FIG. 6 is a schematic diagram illustrating a layout structure of a transistor in a temperature detection device according to an embodiment of the disclosure.

Please refer to FIG. 6 for the following description. FIG. 6 is a schematic diagram illustrating a layout structure of a transistor in a temperature detection device according to an embodiment of the disclosure. In FIG. 6, the transistor MP is a layout structure diagram of a P-type transistor provided in the temperature detection device, and the transistor MN is a layout structure diagram of an N-type transistor provided in the temperature detection device. The transistor MP includes drift regions 610, 615 and 620, heavily doped regions PP1, PP2, PP3, and NP3, a gate structure GS1 and a buried well region PW1. The drift region 620 is stacked on the drift region 615 and the drift region 615 is stack on the drift region 610. Both of the drift regions 610 and 620 may be N-type drift regions, and the drift regions 610 and 620 are isolated by the drift region 615 with P+ conductive type. The drift region 615 can be connected to a lowest voltage value to isolate the drift regions 610 and 620. The heavily doped regions PP1, PP2, PP3, and NP3 are respectively disposed in multiple regions in the drift region 620. The gate structure GS1 is disposed between the P-type heavily doped regions PP1 and PP2, and covers part of the drift region 620, and is used to form a channel between the P-type heavily doped regions PP1 and PP2. The P-type buried well region PW1 is buried in the drift region 620 and is covered by the P-type heavily doped region PP3.

In this embodiment, the gate structure GS1 is used to form the gate (control end) GT1 of the transistor MP, and the P-type heavily doped regions PP1 and PP2 are used to form the source SO1 and the drain DR1 of the transistor MP, respectively, and the N-type heavily doped region NP3 is used to form the bulk BUK1 of the transistor MP. The P-type heavily doped region PP3 forms a potential pickup PK1 of the P-type buried well region PW1.

In addition, the transistor MN includes drift regions 610 and 620, a well region 630, heavily doped regions NP1, NP2, and PP4, a gate structure GS2 and a buried well region PW2. The drift region 620 is stacked on the drift region 610. The P-type well region 630 is formed in the drift region 620. The heavily doped regions NP1, NP2, and PP4 are respectively disposed in multiple regions of the P-type well region 630. The gate structure GS2 is disposed between the N-type heavily doped regions NP1 and NP2, and covers part of the well region 630, and is used to form a channel between the N-type heavily doped regions NP1 and NP2. The P-type buried well region PW2 is buried in the drift region 620.

In this embodiment, the gate structure GS2 is used to form the gate (control end) GT2 of the transistor MN, and the N-type heavily doped regions NP1 and NP2 are used to form the source SO2 and the drain DR2 of the transistor MN, respectively, and the P-type heavily doped region PP4 is used to form the bulk BUK2 of the transistor MP. The P-type buried well region PW2 provides a potential pickup PK2.

Figure 7A:
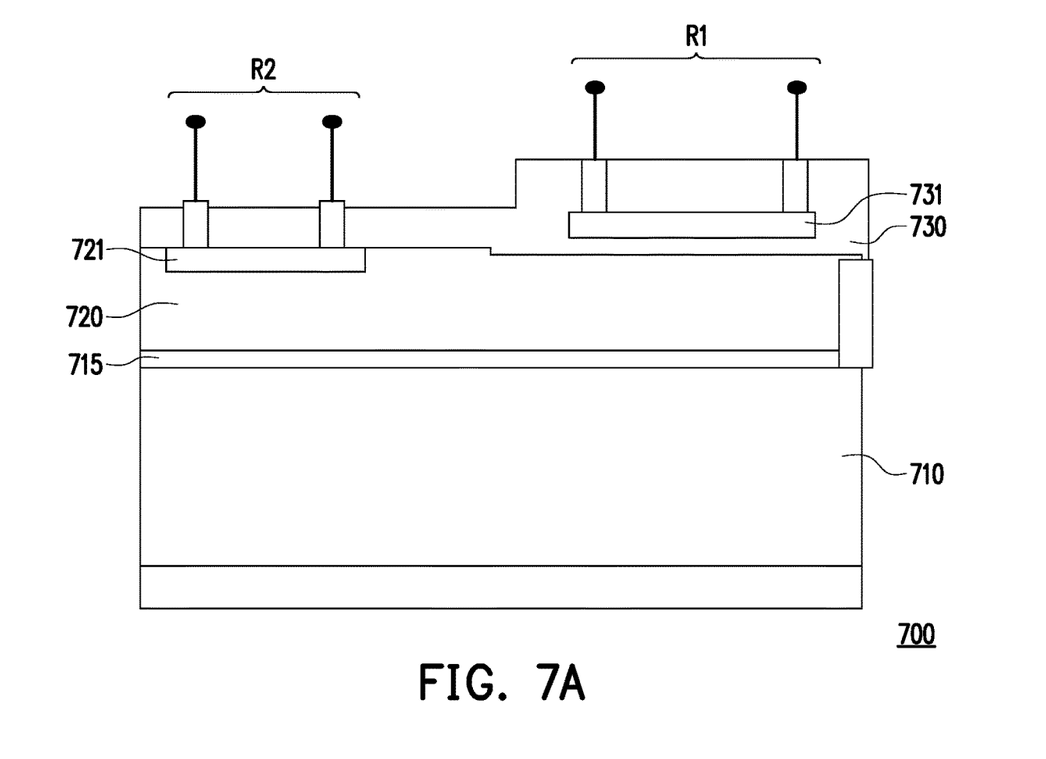
FIG. 7A is a structural diagram of the first resistor and the second resistor in the temperature detection device according to an embodiment of the disclosure.
Figure 7B:
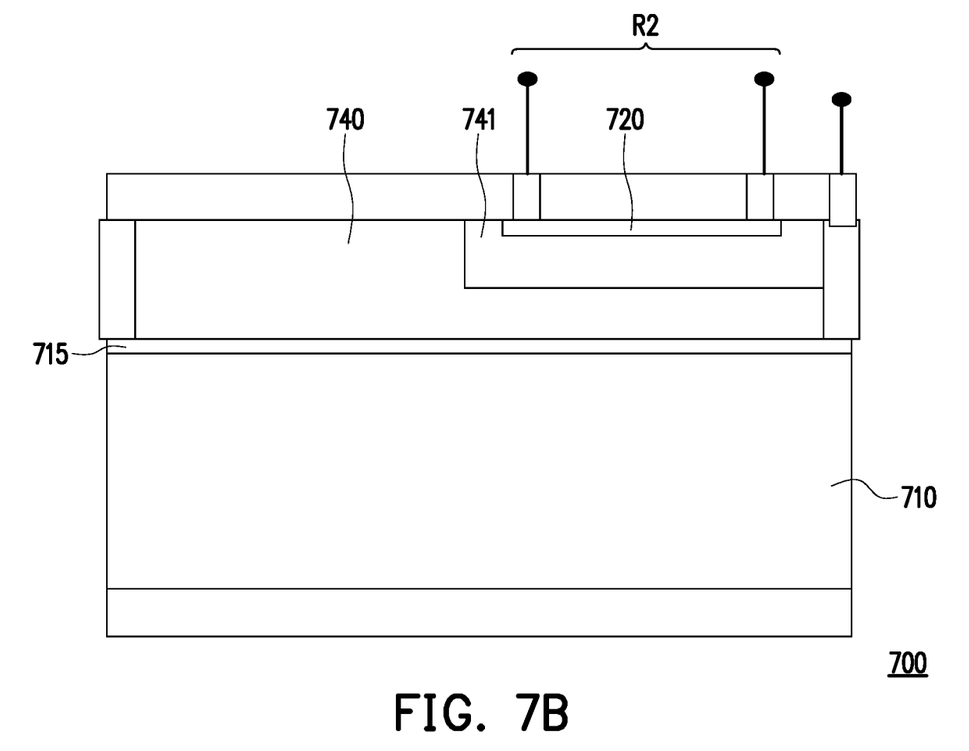
FIG. 7B is a structural diagram of another implementation of the second resistor in the temperature detection device according to an embodiment of the disclosure.

Please refer to FIG. 7A and FIG. 7B. FIG. 7A is a structural diagram of the first resistor and the second resistor in the temperature detection device according to an embodiment of the disclosure. FIG. 7B is a structural diagram of another implementation of the second resistor in the temperature detection device according to an embodiment of the disclosure. In FIG. 7A, the first resistor R1 and the second resistor R2 may be provided in the same integrated circuit 700. The integrated circuit 700 includes drift regions 710, 720 and 715 and an insulating layer 730. The drift region 720 may be formed on the drift region 710, and the insulating layer 730 may cover the drift region 720. The drift regions 710 and 720 may be isolated by the drift region 715, and a conductive type of the drift region 715 may be different from the conductive types of the drift regions 710 and 720 for reducing body effect. The drift region 715 can be connect to a lowest voltage value to isolate the drift regions 710 and 720. The first resistor R1 may be formed of a poly-silicon layer 731 and disposed in the insulating layer 730. In addition, the second resistor R2 may be formed of a P-type SiC diffusion layer 721 and disposed in the drift region 720.

In FIG. 7B, when the second resistor R2 is an N-type SiC diffusion resistor, the integrated circuit 700 may further have a P-type well region 740. The P-type well region 740 is provided in the drift region 720. The second resistor R2 may be configured by an N-type SiC diffusion layer 741, and the N-type SiC diffusion layer 741 may be formed in the P-type well region 740.

It may be known from FIG. 6 and FIGS. 7A and 7B that the temperature detection device of the embodiment of the disclosure may be integrated and disposed in the same integrated circuit, which may effectively save the circuit area.

Figure 8:
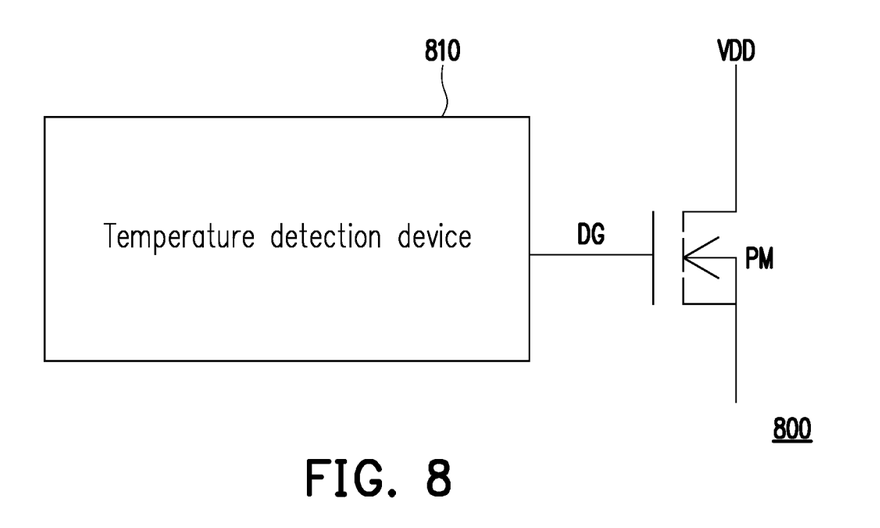
FIG. 8 is a schematic diagram of an electronic device according to an embodiment of the disclosure.

Please refer to FIG. 8. FIG. 8 is a schematic diagram of an electronic device according to an embodiment of the disclosure. The electronic device 800 includes a temperature detection device 810 and a power transistor PM. The temperature detection device 810 is coupled to the power transistor PM. The temperature detection device 810 is used for generating a driving voltage DG to the control end of the power transistor PM according to the ambient temperature. One end of the power transistor PM receives an operating power VDD. When the temperature detection device 810 detects that an over-temperature phenomenon occurs, the over-temperature protection mechanism may be activated, and the power transistor PM is turned off by the generated driving voltage DG. When the power transistor PM is turned off, the operating power VDD may not be supplied to the load end, so that the circuit of the load end and the power transistor PM are not damaged.

In addition, when the temperature detection device 810 detects that the over-temperature phenomenon does not occur, the driving voltage DG may be provided to turn on the power transistor PM. When the power transistor PM is turned on, the operating power VDD may be normally supplied to the load end and perform normal operation.

The temperature detection device 810 in this embodiment may be implemented by applying any one of the temperature detection devices 100, 300, 400 and 500 mentioned in the foregoing embodiments. For details of the operations, please refer to the foregoing embodiments, which will not be repeated here.

In this embodiment, the power transistor PM is a high withstand voltage transistor, and may be an N-type transistor.

Figure 9:
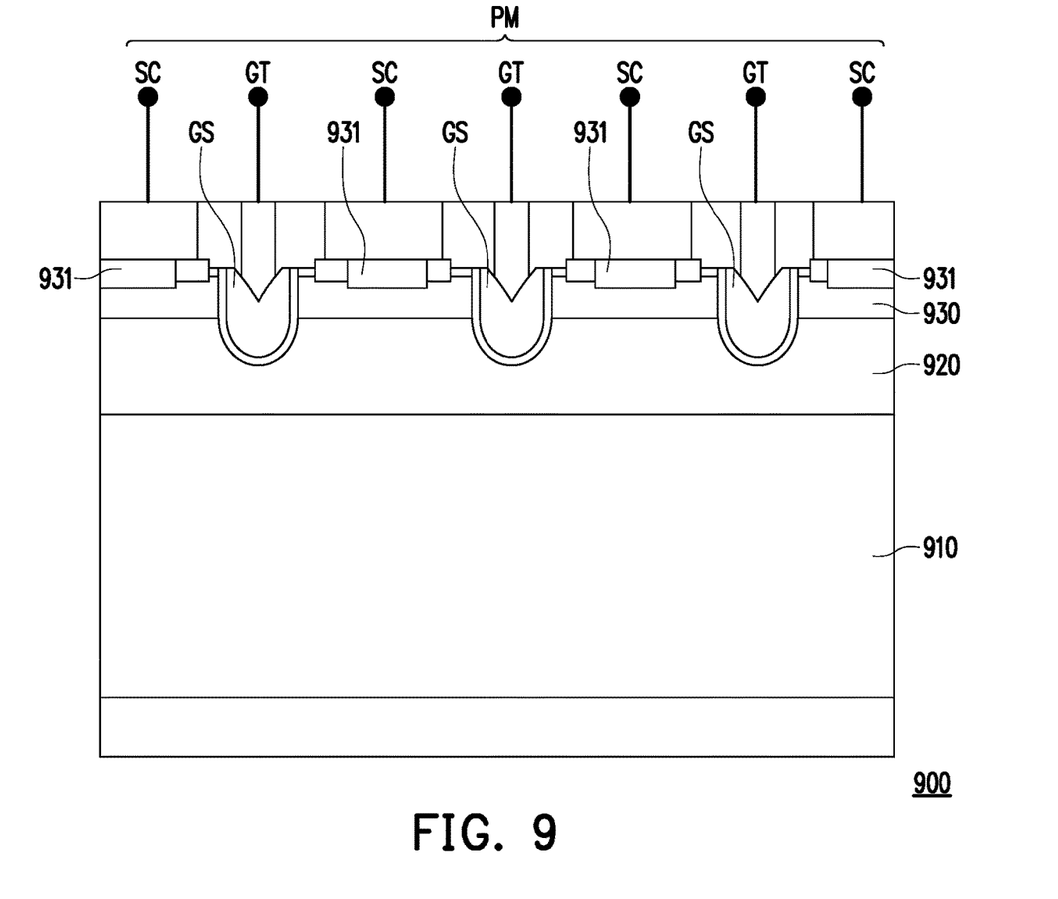
FIG. 9 is a schematic structural diagram of a power transistor in an electronic device according to an embodiment of the disclosure.

Please refer to FIG. 9. FIG. 9 is a schematic structural diagram of a power transistor in an electronic device according to an embodiment of the disclosure. The power transistor PM may be formed on the integrated circuit 900. The integrated circuit 900 includes drift regions 910 and 920 and a P-type well region 930. The drift region 920 is formed on the drift region 910, and the P-type well region 930 is formed on the drift region 920. Multiple gate structures GS may be formed in the P-type well region 930 and the drift region 920, and together form the gate GT of the power transistor PM. In addition, multiple P-type heavily doped regions 931 are respectively formed on multiple regions of the P-type well region 930, and together form the source SC of the power transistor PM.

In addition, the drain of the power transistor PM may be formed on the backside of the integrated circuit 900.

Figure 10:
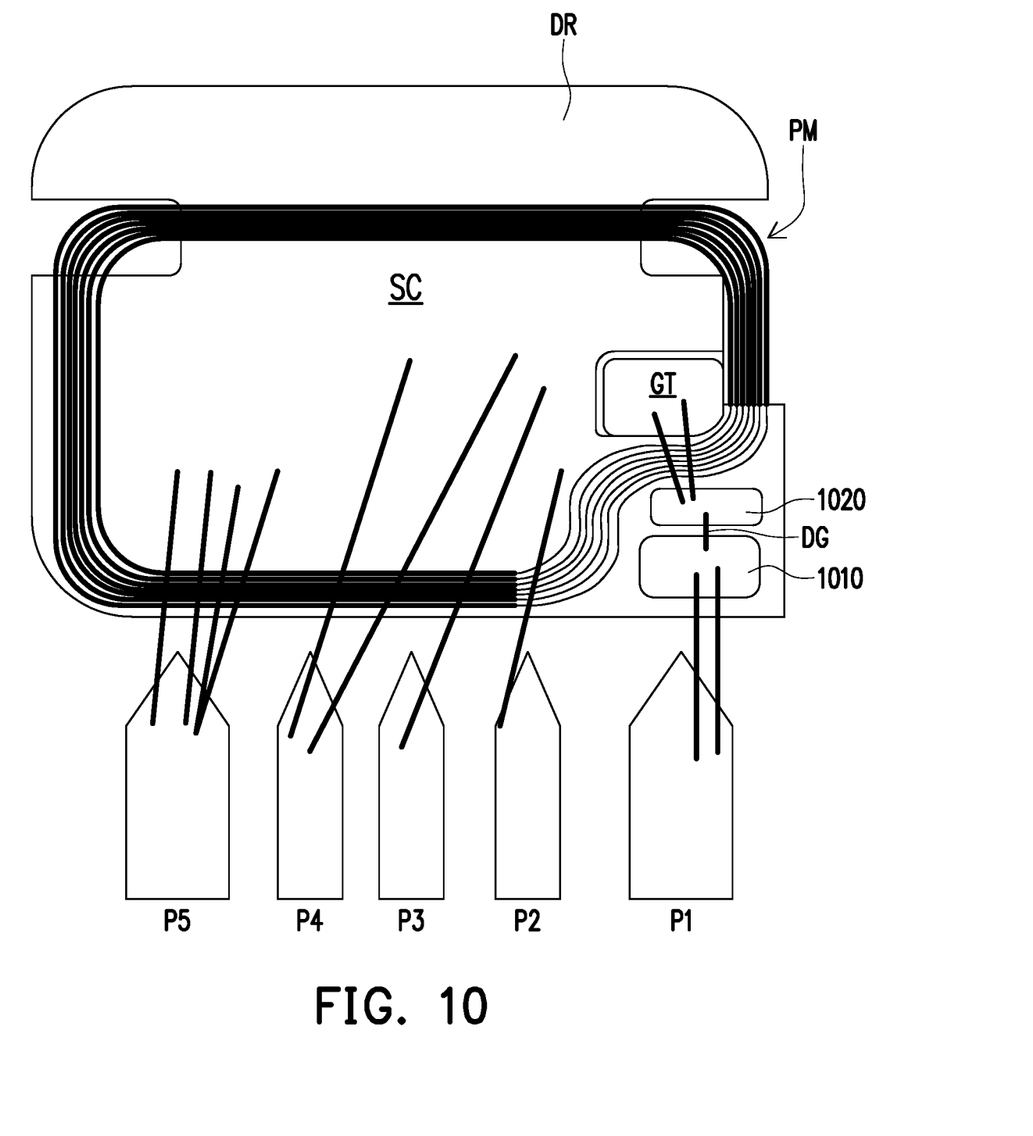
FIG. 10 is a schematic structural diagram of an electronic device according to an embodiment of the disclosure.

Please refer to FIG. 10. FIG. 10 is a schematic structural diagram of an electronic device according to an embodiment of the disclosure. The electronic device 1000 includes a temperature detection device 1010 and a power transistor PM. The power transistor PM includes a gate GT, a source SC, and a drain DR. The gate GT and the source SC of the power transistor PM may be formed on the same surface, and the drain DR of the transistor PM may be formed on the backside of the electronic device 1000. The temperature detection device 1010 may transmit the generated driving voltage DG to a wire bonding region 1020 through wires, and transmit the driving voltage DG to the gate GT of the transistor PM through the transmission wire between the wire bonding region 1020 and the gate GT.

In addition, the electronic device 1000 may have multiple pins P1 to P5, and the pin P1 is electrically connected to the temperature detection device 1010 through multiple wires. The pins P2 to P5 may be electrically connected to the source SC of the transistor PM through multiple wires.

To sum up, the temperature detection device of the disclosure performs the sensing operation of the ambient temperature by disposing the first resistor and the second resistor with different temperature sensitivities. When an over-temperature phenomenon occurs in the electronic device, the temperature detection device may quickly activate the over-temperature protection mechanism, and quickly cut off the supply path of the operating power in the electronic device, so as to protect the circuit elements in the electronic device from damage.

What is claimed is:

1. A temperature detection device comprising:
   a differential stage circuit having a first differential end and a second differential end and comprising:
      a cross-coupled transistor element receiving a first voltage and coupled to the first differential end and the second differential end;
      a first resistor coupled between the first differential end and a second voltage, wherein the first resistor is poly-silicon resistor; and
      a second resistor coupled between the second differential end and the second voltage, wherein the second resistor is silicon carbide diffusion resistor; and
   an output stage circuit coupled to the first differential end and the second differential end and generating a driving voltage according to a first control voltage on the first differential end and a second control voltage on the second differential end.

2. The temperature detection device according to claim 1, wherein the cross-coupled transistor element comprises:
   a first transistor having a first end receiving the first voltage, a second end of the first transistor coupled to the first differential end, and a control end of the first transistor coupled to the second differential end; and
   a second transistor having a first end receiving the first voltage, a second end of the second transistor coupled to the second differential end, and a control end of the second transistor coupled to the first differential end.

3. The temperature detection device according to claim 2, wherein the output stage circuit comprises:
   a third transistor having a first end receiving the first voltage, and a control end of the third transistor coupled to the first differential end; and
   a fourth transistor having a first end coupled to a second end of the third transistor, a second end of the fourth transistor receiving the second voltage, and a control end of the fourth transistor coupled to the second differential end,
   wherein the third transistor and the fourth transistor are P-type transistors.

4. The temperature detection device according to claim 2, wherein the output stage circuit comprises:
   a third transistor having a first end receiving the first voltage, and a control end of the third transistor coupled to the second differential end; and
   a fourth transistor having a first end coupled to a second end of the third transistor, a second end of the fourth transistor receiving the second voltage, and a control end of the fourth transistor coupled to the first differential end,
   wherein the third transistor and the fourth transistor are N-type transistors.

5. The temperature detection device according to claim 2, wherein the first voltage is a power supply voltage, the second voltage is a reference ground voltage, and both the first transistor and the second transistor are P-type transistors.

6. The temperature detection device according to claim 5, wherein each of the first transistor and the second transistor comprises:
   a first drift region;
   a second drift region disposed on the first drift region;
   a first heavily doped region disposed in the second drift region;
   a second heavily doped region disposed in the second drift region; and
   a gate structure disposed between the first heavily doped region and the second heavily doped region to form a channel between the first heavily doped region and the second heavily doped region.

7. The temperature detection device according to claim 6, wherein each of the first transistor and the second transistor further comprises:
   a buried well region buried in the second drift region; and
   a third heavily doped region disposed on the buried well region.

8. The temperature detection device according to claim 2, wherein the first voltage is a reference ground voltage, the second voltage is a power supply voltage, and both the first transistor and the second transistor are N-type transistors.

9. The temperature detection device according to claim 8, wherein each of the first transistor and the second transistor comprises:
   a first drift region;
   a second drift region disposed on the first drift region;
   a well region disposed in the second drift region;
   a first heavily doped region disposed in the well region;
   a second heavily doped region disposed in the well region; and
   a gate structure disposed between the first heavily doped region and the second heavily doped region to form a channel between the first heavily doped region and the second heavily doped region.

10. The temperature detection device according to claim 9, wherein each of the first transistor and the second transistor further comprises:
    a buried well region buried in the second drift region.

11. The temperature detection device according to claim 1, wherein the second resistor is a P-type silicon carbide diffusion resistor or an N-type silicon carbide diffusion resistor.

12. The temperature detection device according to claim 11, wherein when the second resistor is a P-type silicon carbide diffusion resistor, the second resistor comprises:
a P-type diffusion region disposed in a drift region.

13. The temperature detection device according to claim 11, wherein when the second resistor is an N-type silicon carbide diffusion resistor, the second resistor comprises:
an N-type diffusion region disposed in a well region, wherein the well region is disposed in a drift region.

14. An electronic device with an over-temperature protection mechanism, comprising:
a temperature detection device comprising:
a differential stage circuit having a first differential end and a second differential end and comprising:
a cross-coupled transistor element receiving a first voltage and coupled to the first differential end and the second differential end;
a first resistor coupled between the first differential end and a second voltage, wherein the first resistor is poly-silicon resistor; and
a second resistor coupled between the second differential end and the second voltage, wherein the second resistor is silicon carbide diffusion resistor; and
an output stage circuit coupled to the first differential end and the second differential end and generating a driving voltage according to a first control voltage on the first differential end and a second control voltage on the second differential end; and
a power transistor receiving an operating power and controlled by the driving voltage.

15. The electronic device according to claim 14, wherein the cross-coupled transistor element comprises:
a first transistor having a first end receiving the first voltage, a second end of the first transistor coupled to the first differential end, and a control end of the first transistor coupled to the second differential end; and
a second transistor having a first end receiving the first voltage, a second end of the second transistor coupled to the second differential end, and a control end of the second transistor coupled to the first differential end.

16. The electronic device according to claim 14, wherein the output stage circuit comprises:
a third transistor having a first end receiving the first voltage, and a control end of the third transistor coupled to one of the first differential end and the second differential end; and
a fourth transistor having a first end coupled to a second end of the third transistor, a second end of the fourth transistor receiving the second voltage, and a control end of the fourth transistor coupled to the other of the first differential end and the second differential end.

17. The electronic device according to claim 14, wherein the first voltage is a power supply voltage, the second voltage is a reference ground voltage, and both the first transistor and the second transistor are P-type transistors; or the first voltage is a reference ground voltage, the second voltage is a power supply voltage, and both the first transistor and the second transistor are N-type transistors.

18. The electronic device according to claim 14, wherein the second resistor is a P-type silicon carbide diffusion resistor or an N-type silicon carbide diffusion resistor.

* * * * *